United States Patent [19]

Badesha et al.

[11] Patent Number: 4,842,973
[45] Date of Patent: Jun. 27, 1989

[54] VACUUM DEPOSITION OF SELENIUM ALLOY

[75] Inventors: Santokh S. Badesha, Pittsford; Paul Cherin, Fairport; Geoffrey M. T. Foley, Fairport; Barry A. Lees, Fairport; John Wozniak, Webster, all of N.Y.

[73] Assignee: Xerox Corporation, Stamford, Conn.

[21] Appl. No.: 179,374

[22] Filed: Apr. 8, 1988

[51] Int. Cl.⁴ ............................................ G03G 5/082
[52] U.S. Cl. .................................... 430/128; 427/76; 420/579
[58] Field of Search ....................... 430/128; 427/76; 420/579

[56] References Cited

U.S. PATENT DOCUMENTS

| | | | |
|---|---|---|---|
| 3,524,754 | 8/1970 | Cerlon et al. | 252/501.1 |
| 3,785,806 | 1/1974 | Henriksson | 430/84 X |
| 3,984,585 | 10/1976 | Onozaki et al. | 430/128 |
| 4,015,029 | 3/1977 | Elchisak | 427/76 |
| 4,205,098 | 5/1980 | Kobayashi et al. | 427/76 |
| 4,297,424 | 10/1981 | Hewitt | 430/58 |
| 4,414,179 | 11/1983 | Robinette | 420/579 |
| 4,484,945 | 11/1984 | Badesha et al. | 420/579 |
| 4,551,303 | 11/1985 | Moriguchi et al. | 420/579 X |
| 4,554,230 | 11/1985 | Foley et al. | 430/58 |
| 4,583,608 | 4/1986 | Field et al. | 148/1 |
| 4,585,621 | 4/1986 | Oda et al. | 420/579 |
| 4,609,605 | 9/1986 | Lees et al. | 430/57 |
| 4,632,849 | 12/1986 | Ogawa et al. | 427/248.1 |
| 4,710,442 | 12/1987 | Koelling et al. | 430/85 |
| 4,770,965 | 9/1988 | Fender et al. | 430/66 |
| 4,780,836 | 10/1988 | Hordon | 430/58 |

FOREIGN PATENT DOCUMENTS

| | | | |
|---|---|---|---|
| 60-144752 | 7/1985 | Japan | 430/128 |
| 61-65253 | 4/1986 | Japan | 430/128 |

Primary Examiner—Roland E. Martin
Attorney, Agent, or Firm—Peter H. Kondo; Judith L. Byorick

[57] ABSTRACT

A process for fabricating an electrophotographic imaging member is disclosed comprising providing in a vacuum chamber at least one crucible containing particles of an alloy comprising selenium and an alloying component selected from the group consisting of tellurium, arsenic, and mixtures thereof, providing a substrate in the vacuum chamber, applying a partial vacuum to the vacuum chamber, and rapidly heating the crucible to a temperature between about 250° C. and 450° C. to deposit a thin continuous selenium alloy layer on the substrate. A plurality of selenium containing layers may be formed by providing in a vacuum chamber at least one first layer crucible containing particles of selenium or a sellenium alloy, at least one second layer crucible containing particles of an alloy comprising selenium, and a substrate, applying a partial vacuum to the vacuum chamber, heating the particles in the first layer crucible to deposit a thin continuous selenium or a selenium alloy first layer on the substrate, maintaining the particles in the second layer crucible at a first temperature below about 130° C. while the thin continuous selenium or a selenium alloy first layer is being deposited on the substrate, and rapidly heating the particles in the second layer crucible to a second temperature between about 250° C. and about 450° C. to deposit a thin continuous selenium alloy second layer on the substrate.

12 Claims, No Drawings

VACUUM DEPOSITION OF SELENIUM ALLOY

BACKGROUND OF THE INVENTION

The present invention relates in general to a process for vacuum depositing a selenium alloy layer onto a substrate for electrophotographic imaging members.

The formation and development of images on the imaging surfaces of electrophotographic imaging members by electrostatic means is well known. One of the most widely used processes being xerography described, for example, in U.S. Pat. No. 2,297,691 to Chester Carlson. Numerous different types of electrophotographic imaging members for xerography, i.e. photoreceptors, can be used in the electrophotographic imaging process. Such electrophotographic imaging members may include inorganic materials, organic materials, and mixtures thereof. Electrophotographic imaging members may comprise contiguous layers in which at least one of the layers performs a charge generation function and another layer forms a charge carrier transport function or may comprise a single layer which performs both the generation and transport functions. These electrophotographic imaging members may be coated with a protective overcoating to improve wear.

Electrophotographic imaging members based on amorphous selenium have been modified to improve panchromatic response, increase speed and to improve color copyability. These devices are typically based on alloys of selenium with tellurium and/or arsenic. The selenium electrophotographic imaging members may be fabricated as single layer devices comprising a selenium-tellurium, selenium-arsenic or selenium-tellurium-arsenic alloy layer which performs both charge generation and charge transport functions. The selenium electrophotographic imaging members may also comprise multiple layers such as, for example, a selenium alloy transport layer and a contiguous selenium alloy generator layer.

A common technique for manufacturing photoreceptor plates involves vacuum deposition of a selenium alloy to form an electrophotographic imaging layer on a substrate. Tellurium is incorporated as an additive for the purpose of enhancing the spectral sensitivity of the photoconductor. Arsenic is incorporated as an additive for the purpose of improving wear characteristics, passivating against crystallization and improving electricals. Typically, the tellurium addition is incorporated as a thin selenium-tellurium alloy layer deposited over a selenium alloy base layer in order to achieve the benefits of the photogeneration characteristics of SeTe with the beneficial transport characteristics of SeAs alloys. Fractionation of the tellurium and/or arsenic composition during evaporation results in a concentration gradient in the deposited selenium alloy layer during vacuum evaporation. Thus, the term "fractionation" is used to describe inhomogeneities in the stoichiometry of vacuum deposited alloy thin films. Fractionation occurs as a result of differences in the partial vapor pressure of the molecular species present over the solid and liquid phases of binary, ternary and other multicomponent alloys. Alloy fractionation is a generic problem with chalcogenide alloys. A key element in the fabrication of doped photoreceptors is the control of fractionation of alloy components such as tellurium and/or arsenic during the evaporation of selenium alloy layers. Tellurium and/or arsenic fractionation control is particularly important because the local tellurium and/or arsenic concentration at the extreme top surface of the structure, denoted as top surface tellurium (TST) or top surface arsenic (TSA), directly affects xerographic sensitivity, charge acceptance, dark discharge, copy quality, photoreceptor wear and crystallization resistance. In single layer low arsenic selenium alloy photoreceptors, arsenic enrichment at the top surface due to fractionation can also cause severe reticulation of the evaporated film. In two layer or multilayer photoreceptors where low arsenic alloys may be incorporated as a base or transport layer, arsenic enrichment at the interface with the layer above can lead to severe residual cycle up problems. In single layer tellurium selenium alloy photoreceptors, tellurium enrichment at the top surface due to fractionation can cause undue sensitivity enhancement, poor charge acceptance and enhancement of dark discharge. In two layer or multilayer photoreceptors where tellurium alloys may be incorporated as a generator layer, tellurium enrichment at the upper surface of the tellurium alloy layer can result in similar undue sensitivity enhancement, poor charge acceptance, and enhancement of dark discharge.

Once method of preparing selenium alloys for evaporation is to grind selenium alloy shot (beads) and compress the ground material into pellet agglomerates, typically 150–300 mg. in weight and having an average diameter of about 6 millimeters (6,000 micrometers). The pellets are evaporated from crucibles in a vacuum coater using a time/temperature crucible designed to minimize the fractionation of the alloy during evaporation.

One shortcoming of a vacuum deposited selenium-tellurium alloy layer in a photoreceptor structure is the propensity of the selenium-tellurium alloy at the surface of the layer to crystallize under thermal exposure in machine service. To retard premature crystallization and extend photoreceptor life, the addition of up to about 5 percent arsenic to the selenium-tellurium alloy was found beneficial without impairment of xerographic performance. It was found that the addition of arsenic to the composition employed to prepare the pellet, impaired the capability of the process to control tellurium fractionation. Selenium-tellurium-arsenic pellets produced by the pelletizing process exhibited a wider variability of top surface tellurium concentrations compared to selenium-tellurium pellets. This wider variability of top surface tellurium concentrations was manifested by a correspondingly wider distribution of photoreceptor sensitivity values than the top surface tellurium concentration variations in the selenium-tellurium alloy pellets. In an extended photoreceptor fabrication run, up to 50 percent of the selenium-tellurium-arsenic pellets were rejected for forming high top surface tellurium concentrations which caused excessive sensitivity in the final photoreceptor.

In deposited layers of alloys of Se-Te, the normal percentages of top surface tellurium can cause excessively high photosensitivity. This photosensitivity is variable and changes as the surface of the layer wears away. Surface injection of corona deposited charge and thermally enhanced bulk dark decay involving carrier generation cause the toner images in the final copies to exhibit a washed out, low density appearance. Excessive dark decay causes loss of high density in solid areas of toner images and general loss of image density.

In three layered photoreceptors containing, for example, a base layer of selenium doped with arsenic and chlorine, a generator layer of selenium doped with tellurium and a top layer of selenium doped with arsenic, there is a susceptibility to changes in the Te concentration profile through the thickness of the SeTe alloy layer due to Te diffusion. The diffusion rate is a function of the concentration of Te. Higher concentrations of Te diffuse at a higher rate. Such diffusion causes changes in the electrical properties as the concentration of Te changes. The diffusion occurs from the middle layer into the adjacent layers, Diffusion is a greater problem in alloys of Se-Te compared to alloys of Se-Te-As because some cross-linking occurs in the latter alloy.

For alloys of Se-As, a sufficiently high concentration of top surface arsenic causes reticulation of the surface of the deposited alloy layer. This occurs as the deposited surface cools down and the differential thermal contraction through the thickness of the layer causes the surface to wrinkle. The deposited layer also exhibits electrical instability with excessive dark decay under certain conditions. When the photoreceptor comprises a single layer Se-As alloy, about 1 to about 2.5 percent by weight arsenic, based on the weight of the entire layer, at the surface of an alloy layer provides protection against surface crystallization. When the concentration of arsenic is greater than about 2.5 percent by weight, reticulation or electrical instability risks become higher. However, the shift in photosensitivity is not large.

In the past, shutters have been used over crucibles to control fractionation. These shutters are closed near the end of the evaporation cycle. The tellurium or arsenic rich material arising from the crucible deposits on the shutter rather than on the photoreceptor. However, in planetary coating systems, installation of shutters is complex, difficult and expensive. Further, after one or more coating runs, it is necessary to clean the surface of the shutters and the resulting debris can cause defects to occur in subsequently formed photoreceptor layers.

Thus, a significant problem encountered in the fabrication of selenium alloy photoreceptors is the fractionation or preferential evaporation of a species such that the resulting film composition does not replicate the original composition. In other words, the deposited film or layer does not have a uniform composition extending from one surface to the other. For example, when tellurium is the dopant, the tellurium concentration is unduly high at the top surface and approaches zero at the bottom of the vacuum deposited layer. This problem is also observed for alloys of Se-Te, Se-As, Se-As-Te, Se-As-Te-Cl, and the like and mixtures thereof.

PRIOR ART STATEMENT

U.S. Pat. No. 4,770,965 to W. Fender et al, filed Dec. 23, 1986 - A process is described which includes heating an alloy comprising selenium and from about 0.05 percent to about 2 percent by weight arsenic until from about 2 percent to about 90 percent by weight of the selenium in the alloy is crystallized, vacuum depositing the alloy on a substrate to form a vitreous photoconductive insulating layer having a thickness of between about 100 micrometers and about 400 micrometers containing between about 0.3 percent and about 2 percent by weight arsenic at the surface of the photoconductive insulating layer facing away from the conductive substrate, and heating the photoconductive insulating layer until only the selenium in the layer adjacent the substrate crystallizes to form a continuous substantially uniform crystalline layer having a thickness up to about one micrometer. A thin protective overcoating layer is applied on the photoconductive insulating layer. The selenium-arsenic alloy may be at least partially crystallized by placing the selenium alloy in shot form in a crucible in a vacuum coater and heating to between about 93° C. (200° F.) and about 177° C. (350° F.) for between about 20 minutes and about one hour to increase crystallinity and avoid reticulation. Preferably, the selenium-arsenic alloy material in shot form is heated until from about 2 percent to about 90 percent by weight of the selenium in the alloy is crystallized. The selenium-arsenic alloy material shot may be crystallized completely prior to vacuum deposition to ensure that a uniform starting point is employed. However, if desired, a completely amorphous alloy may be used as the starting material for vacuum deposition. In Examples II and V of this copending patent application, halogen doped selenium-arsenic alloy shot contained about 0.35 percent by weight arsenic, about 11.5 parts per million by weight chlorine, and the remainder selenium, based on the total weight of the alloy was heat aged at 121° C. (250° F.) for 1 hour in crucibles in a vacuum coater to crystallize the selenium in the alloy. After crystallization, the selenium alloy was evaporated from chrome coated stainless steel crucibles at an evaporation temperature of between about 204° C. (400° F.) and about 288° C. (550° F.).

U.S. Pat. No. 4,780,386, to M. Hordon et al, filed Nov. 28, 1986 - A process is described in which the surfaces of large particles of an alloy comprising selenium, tellurium and arsenic, the particles having an average particle size of at least 300 micrometers and an average weight of less than about 1000 mg, are mechanically abraded while maintaining the substantial surface integrity of the large particles to form between about 3 percent by weight to about 20 percent by weight dust particles of the alloy based on the total weight of the alloy prior to mechanical abrasion. The alloy dust particles are substantially uniformly compacted around the outer periphery of the large particles of the alloy. The large particles of the alloy may be beads of the alloy having an average particle size of between about 300 micrometers and about 3,000 micrometers or pellets having an average weight between about 50 mg and about 1000 mg, the pellets comprising compressed finely ground particles of the alloy having an average particle size of less than about 200 micrometers prior to compression. In one preferred embodiment, the process comprises mechanically abrading the surfaces of beads of an alloy comprising selenium, tellurium and arsenic having an average particle size of between about 300 micrometers and about 3,000 micrometers while maintaining the substantial surface integrity of the beads to form a minor amount of dust particles of the alloy, grinding the beads and the dust particles to form finely ground particles of the alloy, and compressing the ground particles into pellets having an average weight between about 50 mg and about 1000 mg. In another embodiment, mechanical abrasion of the surface of the pellets after the pelletizing step may be substituted for mechanical abrasion of the beads. The process includes providing beads of an alloy comprising selenium, tellurium and arsenic having an average particle size of between about 300 micrometers and about 3,000 micrometers, grinding the beads to form finely ground particles of the alloy having an average particle size of less than about 200 micrometers, compressing the ground particles into pellets having an average weight between about 50 mg and about 1000 mg, and mechanically abrading the surface of the pellets to form alloy dust particles while maintaining the substantial surface integrity of the pellets. If desired, the process may include both the steps of mechanically abrading the surface of the beads and mechanically abrading the surface of the pellets. The selenium-tellurium-arsenic alloy in the pellets may then be vacuum deposited to form a photoconductive layer of an electrophotographic imaging member which comprises a substrate and, optionally, one or more other layers.

U.S. Pat. No. 4,710,442 to Koelling et al, issued Dec. 1, 1987 - An arsenic-selenium photoreceptor is disclosed wherein the concentration of arsenic increases from the bottom surface to the top surface of the photoreceptor such that the arsenic concentration is about 5 weight percent at a depth about 5 to 10 microns on the top surface of the photoreceptor and is about 30 to 40 weight percent at the top surface of the photoreceptor. The photoreceptor is prepared by heating a mixture of selenium-arsenic alloys in a vacuum in a step-wise manner such that the alloys are sequentially deposited on the substrate to form a photoconductive film with an increasing concentration of arsenic from the substrate interface to the top surface of the photoreceptor. In one specific embodiment, a mixture of 3 selenium-arsenic alloys are maintained at an intermediate temperature in the range of from about 100+ to 130° C. for a period of time sufficient by dry the mixture. The alloy may also contain a halogen. In Example X, the drying step temperature was attained in about 2 minutes and maintained for a period of approximately 3 minutes.

U.S. Pat. No. 4,609,605 to Lees et al, issued Sept. 2, 1986 - A multilayered electrophotographic imaging member is disclosed in which one of the layers may comprise a selenium-tellurium-arsenic alloy. The alloy can be prepared by grinding selenium-tellurium-arsenic alloy beads, with or without halogen doping, preparaing pellets having an average diameter of about 6 mm from the ground material, and evaporating the pellets in crucibles in a vacuum coater.

U.S. Pat. No. 4,205,098 to Kobayasho et al, issued May 27, 1980 - A process is disclosed in which a powdery material of selenium alone or at least with one additive is compacted under pressure to produce tablets, the tablets being degassed by heating the tablets at an elevated temperature below the melting point of the metallic selenium and thereafter using the tablets as a source for vacuum deposition. The tablets formed by compacting the powdery selenium under pressure may be sintered at a temperature between about 100° C. and about 220° C. Typical examples of sintering conditions include 210° C. for between about 20 minutes and about 1 hour and about 1 to about 4 hours at 100° C. depending upon compression pressure. Additives mentioned include Te, As, Sb, Bi, Fe, Tl, S, l, F, Cl, Br, B, Ge, PbSe, CuO, Cd, Pb, BiCl$_3$, SbS$_3$, Bi$_2$, S$_3$, Zn, CdS2, SeS and the like. In one example, tablets having a thickness of 2mm and a diameter of 6 mm were sintered and degassed at about 210° C. for about 18 minutes.

U.S. Pat. No. 4,297,424 to Hewitt, issued Oct. 27, 1981 - A process is disclosed for preparing a photoreceptor wherein selenium-tellurium-arsenic alloy shot is ground, formed into pellets and vacuum evaporated.

U.S. Pat. No. 4,554,230 to Foley et al. issued Nov. 19, 1985 - A method is disclosed for fabricating a photoreceptor wherein selenium-arsenic alloy beads are ground, formed into pellets and vacuum evaporated.

In U.S. Pat. No. 4,205,098 to Kobayashi et al, issued May, 27, 1980 - A method for producing selenium pellets is disclosed wherein selenium or selenium and additives are formed into powder and then compacted into pellets and vacuum evaporated. The additives may include tellurium and arsenic.

U.S. Pat. No. 3,524,754 to Cerlon et al, issued Aug. 18, 1970 - A process is disclosed for preparing a photoreceptor wherein selenium-arsenic-antimony alloys are ground into fine particles and vacuum evaporated.

U.S. Pat. No. 4,583,608 to Field et al, issued Apr. 22, 1986 - Heat treatment of single crystal superalloy particles are described. In one embodiment, single crystal particles are heat treated by using a heat treatment cycle during the initial stages of which incipient melting occurs within the particles being treated. During a subsequent step in heat treatment process substantial diffusion occurs in the particle. In a related embodiment, single crystal articles which have previously undergone incipient melting during a heat treatment process are prepared by a heat treatment process. In still another embodiment, a single crystal composition of various elements including chromium and nickel is treated to heating steps at various temperatures. In column 3, lines 40-47, a stepped treatment cycle is employed in which an alloy is heated to a temperature below about 25° F. of an incipient melting temperature and held below the incipient melting temperature for a period of time sufficient to achieve a substantial amount of alloy homogenization.

U.S. Pat. No. 4,585,621 to Oda et al, issued Apr. 29, 1986 - Various selenium alloys, e.g., Se-Te and Se-As, containing phosphorous are vacuum deposited on a substrate to form a photoreceptor.

U.S. Pat. No. 4,632,849 to Ogawa et al, issued Dec. 30, 1986 - A method for making a fine powder of a metallic compound coated with ceramics is described. The process involves heating a gaseous mixture of at least methyl vapor and another element to a temperature not higher than 0.8 times as low as the melting point of the metal so that the metal and other element are reactive with each other while rapidly cooling to form a fine powder metallic compound. The metallic powder is further passed into another metal vapor to cover the metal powder with the other metal. The reaction system is cooled to a region in which the metal compound is kept stable to prevent further growth of the particles.

Swiss Patent Publication No. CH-656-486-A, published June 30, 1986 -PbTe, PbSn, PbSnTe, ZnTe, CdTe and CdHgTe are produced by liquid phase epitaxy, the solvent for the telluride being a melt of arsenic telluride and/or antimony telluride.

Japanese Patent Publication No. J6 0172-346-A, published Sept. 5, 1985 - TlSe are placed in a crucible and heated at 180°-190° C., Mg is added to the melting alloy, the temperature is raised to the 200°-220° C. and allowed to stand at this temperature to form a uniform alloy of TlMgSe. The alloy is used in electric field-releasing ion beam generators.

U.S. Pat. No. 4,484,945 to Badesha et al, issued Nov. 27,1984—A process is disclosed for preparing chalcogenide alloys by providing a solution mixture of oxides of the desired chalcogens and subsequently subjecting this mixture to a simultaneous co-reduction reaction. Generally the reduction reaction is accomplished at relatively low temperature, not exceeding about 120° C.

Japanese Patent Publication No. 57-1567 to Tokyo Shibaura Denki K.K., published June 7, 1982 - An amorphous photoconductive material is obtained by combining selenium, arsenic, antimony and tellurium. This raises the glass transition point.

U.S. Pat. No. 4,414,179 to Robinette, issued Nov. 8, 1983—A process is disclosed for preparing a selenium alloy comprising heating a mixture comprising selenium, arsenic and chlorine to a temperature between about 290° C. and about 330° C. to form a molten mixture, agitating the molten mixture to combine the components, continuing all agitation, raising the temperature of the mixture to at least 420° C. for at least about 30 minutes and cooling the mixture until it becomes a solid. This alloy may be vacuum deposited.

U.S. Pat. No. 4,015,029 to Elchiasak, issued Mar. 29, 1977—A selenium alloy evaporation technique for depositing photoconductive material onto a substrate is described. The technique involves incorporating 1 to 80% by weight of at least one non-volatile infra red absorbing heat sink in or within the body of inorganic photoconductive material and thereafter heating the resulting mixture with infra red heat.

U.S. Pat. No. 3,785,806 to Henrickson, issued Jan. 15, 1974—A process is disclosed for producing arsenic doped selenium by mixing finely divided selenium with finely divided arsenic in an atomic ratio of 1:4 and thereafter heating the mixture in an inert atmosphere to obtain a master alloy. The master alloy is then mixed with molten pure selenium to attain an arsenic content of between 0.1 and 2% by weight based on the selenium.

Difficulties continue to be encountered in achieving precise control of tellurium and/or arsenic fractionation in the outer surface of a vacuum deposited photoconductive layer. This, in turn, affects the physical or electrical properties of the final photoreceptor. Photoreceptors containing large batch to batch top surface tellurium or arsenic concentrations tend to exhibit correspondingly large batch to batch variations in physical or electrical properties which is unacceptable in high speed precision copiers, duplicators and printers because of copy quality variations. Moreover, variations in physical or electrical properties as a photoreceptor surface wears away during cycling is unacceptable in high speed precision copiers, duplicators and printers particularly during long length runs where, for example, the copy quality should be uniform from the first copy to thousands of copies. Modern sophisticated, high speed copiers, duplicators and printers are constrained by narrow operating windows that require photoreceptors having precise, predictable operating characteristics from one batch to the next and during cycling.

Thus, there is a need for an improved process for preparing photoreceptors comprising selenium alloys containing additives such as tellurium and/or arsenic.

SUMMARY OF THE INVENTION

Accordingly, it is an object of the present invention to provide an improved process for preparing selenium alloy materials for electrophotographic imaging members which overcomes the the abovenoted disadvantages.

It is a further object of the present invention to provide an improved process which controls tellurium fractionation within narrower limits.

It is a further object of the present invention to provide an improved process which controls arsenic fractionation within narrower limits.

It is a further object of the present invention to provide an improved process which controls the sensitivity of photoreceptors to light within narrower limits.

It is a further object of the present invention to provide an improved process which increases photoreceptor fabrication yields.

It is a further object of the present invention to provide an improved process which reduces the level of tellurium fractionation.

It is a further object of the present invention to provide an improved process which reduces the level of arsenic fractionation.

It is a further object of the present invention to provide an improved process which reduces the tellurium distribution variation through the thickness of a selenium-tellurium alloy photoconductive layer.

It is a further object of the present invention to provide an improved process which reduces the arsenic distribution variation through the thickness of a selenium-arsenic alloy photoconductive layer.

It is a further object of the present invention to provide an improved process which controls the electrical cycling characteristics within narrower limits.

It is a further object of the present invention to provide an improved process which controls the mechanical wear characteristics of the photoreceptor surface within narrower limits.

It is a further object of the present invention to provide an improved process which limits the loss of selenium rich species early in the evaporation process.

It is a further object of the present invention to provide an improved process which allows the achievement of TSA and TST values within narrower predefined limits.

It is a further object of the present invention to provide an improved process which produces evaporated films of selenium and its alloys with arsenic and/or tellurium which have superior photoconductive properties.

It is a further object of the present invention to provide an improved process which produces photoconducting devices which provide improved image quality when used in electroxerographic applications.

The above objects and others are accomplished in accordance with the present invention by providing a process for fabricating an electrophotographic imaging member comprising providing in a vacuum chamber at least one crucible containing particles of an alloy comprising selenium and an alloying component selected from the group consisting of tellurium, arsenic, and mixtures thereof, providing a substrate in the vacuum chamber, applying a partial vacuum to the vacuum chamber, and rapidly heating the crucible to a temperature between about 250° C. and 450° C. to deposit a thin continuous selenium alloy layer on the substrate. A plurality of selenium containing layers may be formed by providing in a vacuum chamber at least one first layer crucible containing particles of selenium or a selenium alloy, at least one second layer crucible containing particles of an alloy comprising selenium and an alloying component selected from the group consisting of tellurium, arsenic, and mixtures thereof, and a substrate, applying a partial vacuum to the vacuum chamber, heating the particles in the first layer crucible to deposit a thin continuous selenium or a selenium alloy first layer on the substrate, maintaining the particles in the second layer crucible at a first temperature below about 133° C. while the thin continuous selenium or a selenium alloy first layer is being deposited on the substrate, and rapidly heating the particles in the second layer crucible to a second temperature between about 250° C. and about 450° C. to deposit a thin continuous selenium alloy second layer on the substrate. Preferably, the temperature of the crucible is rapidly raised to between about 300° C. and about 375° C. in between about 5 minutes and about 18 minutes.

The substrate may be opaque or substantially transparent and may comprise numerous suitable materials having the required mechanical properties. The entire substrate may comprise the same material as that in the electrically conductive surface or the electrically conductive surface may merely be a coating on the substrate. Any suitable electrically conductive material may be employed. Typical electrically conductive materials include, for example, aluminum, titanium, nickel, chromium, brass, stainless steel, copper, zinc, silver, tin, and the like. The conductive layer may vary in thickness over substantially wide ranges depending on the desired use of the electrophotoconductive member. Accordingly, the conductive layer may generally range in thickness from about 50 Angstrom units to many centimeters. When a flexible electrophotographic imaging member is desired, the thickness may be between about 100 Angstrom units to about 750 Angstrom units. The substrate may be of any other conventional material including organic and inorganic materials. Typical substrate materials include insulating non-conducting materials such as various resins known for this purpose including polyesters, polycarbonates, polyamides, polyurethanes, and the like. The coated or uncoated substrate may be flexible or rigid and may have any number of configurations such as, for example, a plate, a cylindrical drum, a scroll, an endless flexible belt, and the like. The outer surface of the supporting substrate preferably comprises a metal oxide such as aluminum oxide, nickel oxide, titanium oxide, and the like.

In some cases, intermediate adhesive layers between the substrate and subsequently applied layers may be desirable to improve adhesion. If such adhesive layers are utilized, they preferably have a dry thickness between about 0.1 micrometer to about 5 micrometers. Typical adhesive layers include film-forming polymers such as polyester, polyvinylbutyral, polyvinylpyrolidone, polycarbonate, polyurethane, polymethylmethacrylate, and the like and mixtures thereof. Since the surface of the supporting substrate may be a metal oxide layer or an adhesive layer, the expression "supporting substrate" as employed herein is intended to include a metal oxide layer with or without an adhesive layer on a metal oxide layer.

Any suitable photoconductive chalcogenide alloy including binary, tertiary, quaternary, and the like alloys may be employed to form the vacuum deposited photoconductive layer. Preferred alloys include alloys of selenium with tellurium, arsenic, or tellurium and arsenic with or without a halogen dopant. Typical photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. Photoconductive alloys of selenium are to be distinguished from stoichiometric compounds of selenium such as arsenic triselenide ($As_2Se_3$). Stoihiometric compounds of selenium such as arsenic triselenide appear to present less of a fractionation problem compared to alloys of selenium such as alloys of selenium and tellurium. As employed herein, a selenium alloy is defined as an intermetallic compound of selenium with other elemental additives where the ratios of constituents are inconsistent with stiochiometric compositions. The photoconductive alloys of selenium may be applied to a coated or uncoated substrate alone as the only photoconductive layer or it may be used in conjunction with one or more other layers, such as a selenium or selenium alloy transport layer and/or a protective overcoat layer. Generally, the selenium-tellurium alloy may comprise between about 5 percent by weight and about 40 percent by weight tellurium and a halogen selected from the group consisting of up to about 70 parts per million by weight of chlorine and up to about 140 parts per million by weight of iodine all based on the total weight of the alloy with the remainder being selenium. The selenium-arsenic alloy may, for example, comprise between about 0.01 percent by weight and about 35 percent by weight arsenic and a halogen selected from the group consisting of up to about 200 parts per million by weight of chlorine and up to about 1000 parts per million by weight of iodine all based on the total weight of the alloy with the remainder being selenium. The selenium-tellurium-arsenic alloy may comprise between about 5 percent by weight and about 40 percent by weight tellurium, between about 0.1 percent by weight and about 5 percent by weight arsenic and a halogen selected from the group consisting of up to about 200 parts per million by weight of chlorine and up to about 1000 parts per million by weight of iodine all based on the total weight of the alloy with the remainder being selenium. The expressions "alloy of selenium" and "selenium alloy" are intended to include halogen doped alloys as well as alloys not doped with halogen. When employed as a single photoconductive layer in an electrophotographic imaging member, the thickness of the photoconductive selenium alloy layer is generally between about 0.1 micrometer and about 400 micrometers thick.

Selenium-tellurium and selenium-tellurium-arsenic alloy photoconductive layers are frequently employed as a charge generation layer in combination with a charge transport layer. The charge transport layer is usually positioned between a supporting substrate and the charge generating selenium alloy photoconductive layer. Generally, a selenium-tellurium alloy may comprise from about 60 percent by weight to about 95 percent by weight selenium and from about 5 percent by weight to about 40 percent by weight tellurium based on the total weight of the alloy. The selenium-tellurium alloy may also comprise other components such as less than about 35 percent by weight arsenic to minimize crystallization of the selenium and less than about 1000 parts per million by weight halogen. In a more preferred embodiment, the photoconductive charge generating selenium alloy layer comprises between about 5 percent by weight and about 25 percent by weight tellurium, between about 0.1 percent by weight and about 4 percent by weight arsenic, and a halogen selected from the group consisting of up to about 100 parts per million by weight of chlorine and up to about 300 parts per million by weight of iodine with the remainder being selenium. Compositions for optimum results are dictated by the application. It is desirable, in general, to achieve uniformly homogeneous compositions within the evaporated layers, i.e. to evaporate the alloy materials without significant fractionation. Elevated levels of tellurium lead to excessive photoreceptor light sensitivity and high dark decay and correspondingly reduced levels of tellurium result in low light sensitivity and loss of copy quality. Elevated levels of arsenic in some applications, above about 4 percent by weight, can lead to high dark decay, to problems in cycling stability and to reticulation of the photoreceptor surface. The resistance of amorphous selenium photoreceptors to thermal crystallization and surface wear begins to degrade as the concentration of arsenic drops below about 1 percent by weight. As the chlorine content rises above about 70 parts per million by weight chlorine, the photoreceptor begins to exhibit excessive dark decay.

Any suitable selenium alloy transport layer may be utilized as a transport layer underlying a photoconductive selenium alloy charge generating layer. The charge transport material may, for example, comprise pure selenium, selenium-arsenic alloys, selenium-arsenic-halogen alloys, selenium-halogen and the like. Preferably, the charge transport layer comprises a halogen doped selenium arsenic alloy. Generally, about 10 parts by weight per million to about 200 parts by weight per million of halogen is present in a halogen doped selenium charge transport layer. If a halogen doped transport layer free of arsenic is utilized, the halogen content should normally be less than about 20 parts by weight per million. Inclusion of high levels of halogen in a thick halogen doped selenium charge transport layer free of arsenic leads to excessive dark decay. Imaging members containing high levels of halogen in a thick halogen doped selenium charge transport layer free of arsenic are described, for example, in U.S. Pat. No. 3,635,705 to Ciuffini, U.S. Pat. No. 3,639,120 to Snelling, and Japanese Patent Publication No. J5 61 42-537 to Ricoh, published June 6, 1981. Generally, halogen doped selenium arsenic alloy charge transport layers comprise between about 99.5 percent by weight to about 99.9 percent by weight selenium, about 0.1 percent to about 0.5 percent by weight arsenic and between about 10 parts per million by weight to about 200 parts per million by weight of halogen, the latter halogen concentration being a nominal concentration. The expression "nominal halogen concentration" is defined as the halogen concentration in the alloy evaporated in the crucible. The thickness of the charge transport layer is generally between about 15 micrometers and about 300 micrometers and preferably from about 5 micrometers to about 50 micrometers because of constraints imposed by the xerographic development system, constraints imposed by carrier transport limitations and for reasons of economics. The expression "halogen materials" is intended to include fluorine, chlorine, bromine, and iodine. Chlorine is the preferred halogen because of the ease of handling and stability of chlorine in a vacuum deposited film (apparently due to lack of out diffusion). Transport layers are well known in the art. Typical transport layers are described, for example, in U.S. Pat. No. 4,609,605 to Lees et al and in U.S. Pat. No. 4,297,424 to Hewitt, the entire disclosures of these patents being incorporated herein by reference.

If desired, an interface layer may be positioned between the transport layer and the charge generating photoconductive layer. The interface layer material may, for example, consist essentially of selenium and a nominal halogen concentration of about 50 parts by weight per million to about 2,000 parts by weight per million halogen material with the remainder comprising selenium. Minor additions of arsenic might be added but are relatively undesirable and may require additional halogen to compensate for this arsenic addition. The halogen concentration in the deposited interface layer will typically be somewhat less than that in the alloy evaporated in the crucible. In order to achieve optimal device properties, the actual halogen content in any final interface layer should normally be greater than about 35 parts by weight per million. Inclusion of high levels of halogen in thick halogen doped selenium layers free of arsenic leads to excessive dark decay because dark decay is substantially a function of the total halogen in a multilayer imaging member. Imaging members containing high levels of halogen in a thick halogen doped selenium charge transport layer free of arsenic are described, for example, in U.S. Pat. No. 3,635,705 to Ciuffini, U.S. Pat. No. 3,639,120 to Snelling, and Japanese Patent Publication No. J5 61 42-537 to Ricoh, published June 6, 1981. The use of interface layers is described in U.S. Pat. No. 4,554,230 to Foley et al, the entire disclosure of which is incorporated herein by reference.

The particles employed in the process of this invention may in general be in either shot (bead) particle or pellet particle form. However the particles may also be in chunk or ingot form also if so desired. Generally, to prepare shot (bead) particles, the components of selenium alloys are combined by melting the selenium and additives together by any suitable conventional technique. The molten selenium alloy is then shotted by any suitable method. Shotting is usually effected by quenching molten droplets of the alloy in a coolant such as water to form large particles of alloy in the form of shot or beads. Shotting processes for forming alloy beads are well known and described, for example, in U.S. Pat. No. 4,414,179 to S. Robinette, the entire disclosure of this patent being incorporated herein by reference. The alloy beads may have an average size of, for example, between about 300 micrometers and about 3,000 micrometers. Pellet particles may be prepared from shot particles by grinding shot particles into a powder and thereafter compressing the powder into relatively large pellets. Pelletizing of the amorphous shotted alloy is frequently utilized as a means of controlling fractionation.

Where pellets are to be employed, the alloy beads, or combination of the alloy beads and minor amount of dust particles formed if vigorous mechanical abrasion of the alloy beads is employed, is thereafter rapidly ground in a conventional high speed grinder or attritor to form alloy particles having an average particle size of less than about 200 micrometers. Any suitable grinding device may be utilized to pulverize the bead particles to form the fine alloy particles having an average particle size of less than about 200 micrometers. Typical grinders include hammer mills, jet pulverizers, disk mills, and the like. Depending upon the efficiency of the grinding device employed, grinding alloy beads to form alloy particles having an average particle size of less than about 200 micrometers can normally be accomplished in less than about 5 minutes. Longer grinding times may be employed, if desired.

After grinding, the fine alloy particles having an average particle size of less than about 200 micrometers are compressed by any suitable technique into large particles of alloy usually referred to as pellets having an average weight between about 50 mg and about 1000 mg. A pellet weight greater than about 50 mg is preferred for ease of handling. When the pellet weight exceeds about 1000 mg, evaporation discontinuities are observed. The pellets may be of any suitable shape. Typical shapes include cylinders, spheres, cubes, tablets, and the like. Compression of the alloy particles into pellets may be accomplished with any suitable device such as, for example, a simple punch tableting press, a multi punch rotary tableting press, and the like.

If desired, selenium alloy shot or pellet particles may be subjected to a variety of treatments to produce surface crystallization. The surface crystallization which is produced at low temperatures allows subsequent bulk precrystallization to occur at higher temperatures without the usual agglomeration of the alloy particles. Nucleation and growth of crystallites on the surface of the alloy particles can be induced by a variety of techniques including low temperature thermal treatment of material whose outer surface has been mechanically abraded, low temperature thermal treatment during exposure to ultraviolet radiation, electron beam irradiation, gamma ray irradiation, x-radiation, and exposure to solvents and chemical vapors. The thermal treatment of abraded alloy particles is the preferred method of including this surface crystallization.

A suitable abrasion technique is described in U.S. Pat. No. 4,780,386, to M. Hordon et al, filed November 28, 1986, the entire disclosure of which is incorporated herein by reference. Abrasion can be carried out by merely tumbling the shot or pellet particles together in a suitable device such as a roll mill. The alloy beads may, in one embodiment, be mechanically abraded while maintaining the substantial surface integrity of the beads to form a minor amount of dust particles from the alloy beads. This "minor amount" of alloy dust particles generally comprises between about 3 percent by weight to about 20 percent by weight of the total weight of the alloy prior to mechanical abrasion. Generally, alloy dust particles are created by imparting a vigorous tumbling action to the bead particles. Although the bead particles impact each other and against the mechanical device that imparts the tumbling or other suitable abrasive movement to the particles, the abrasive action should be sufficient to create dust particles having an average particle size of less than about 10 micrometers while avoiding any substantial crushing of the bead particles. More specifically, substantial surface integrity (i.e. bead shape) of the beads is maintained when less than about 20 percent by weight of the alloy beads, based on the weight of the total alloy, is fractured during the period when the beads are mechanically abraded to form the alloy dust. In other words, although the surface of the beads may be pitted and nicked, the overall bead shape is substantially conserved for at least about 80 percent by weight of the alloy beads. The time that the alloy beads should be mechanically abraded depends upon numerous factors such as the size of the alloy bead batch, the type of device employed to impart mechanical abrasion to the beads, the amount of crystal nucleation sites desired, and the like. The abrasion time should be sufficient to generate significant levels of nucleation sites at the particle surface while maintaining the substantial surface integrity of the bead particles. The alloy dust particles adhere to the surface of the bead particles much like toner particles adhere to the surface of carrier particles in two component electrophotographic developer mixtures and are substantially uniformly compacted around the outer periphery of bead particles. Any suitable device may be utilized to mechanically abrade the alloy beads and form the alloy dust particles. Typical devices for mechanically abrading particles by tumbling include vaned roll blenders, vibrating tubs, conical screw mixers, V-shaped twin shell mixers, doublecone blenders, and the like.

Where it is desired to surface crystallize alloy pellets the abrasion step may be omitted, the grinding and pelletizing processes generating sufficient levels of nucleation sites that subsequent surface crystallization is readily achieved.

After forming crystal nuclei on at least the surface of the particles, pre-crystallization of the selenium alloy to form at least a thin, substantially continuous layer of crystalline material covering the outer surface of the selenium alloy particles may be carried out by heating at low temperatures. As employed herein, the expression "thin, substantially continuous layer of selenium crystals" is defined as a layer of crystalline material whose surface area coverage of the alloy particle exceeds about 80 percent and more preferably approaches 100 percent. Precrystallization of the alloy surface may be determined by any suitable technique. Typical techniques for detecting selenium crystallization include x-ray diffraction, electron diffraction and the like. Heating may be effected, for example, with any suitable device such as an oven.

Surface pre-crystallization of shot or pellets effected at low temperatures far below the softening point of the alloy followed by further bulk crystallization at relatively higher temperatures enhances control of fractionation of selenium arsenic alloys, selenium tellurium alloys and selenium tellurium arsenic alloys with or without halogen dopants and avoids any significant agglomeration of shot or pellets. Any suitable low temperature thermal treatment technique may be utilized to achieve surface pre-crystallization of shot or pellets. If surface precrystallization of shot or pellets it utilized, the temperature and time employed ought to be sufficient to form a thin, substantially continuous crystalline layer that surrounds an amorphous core of selenium alloy material. Generally, the particles ought to be heated to a temperature between about 50° C. and about 80° C. far below the softening temperature of the particles until at least a thin, substantially continuous layer of crystalline material is formed at the surface of said particles and the core of selenium alloy in the particles remains in an amorphous state. The softening temperature for any given alloy may be determined experimentally by conducting constant temperature runs at incrementally increased temperatures for different batches until the shot or beads in a given batch begin to agglomerate during the thermal treatment. Typical pre-crystallization techniques include subjecting each surface of shot or pellets to temperatures of between about 50° C. and about 80° C. for between about 30 minutes and about 8 hours for a selenium alloy comprising between about 0.3 and 2 percent by weight arsenic, between about 5 and about 15 percent by weight tellurium and the remainder selenium. For example, a thin, substantially continuous layer of crystalline material was formed at the surface of abraded alloy shot comprising about 0.5 percent As, about 12 ppm chlorine and the remainder Se by heating the shot at about 60° C. for about 3 hours. Aging of shot material over long periods of time at either room temperature or temperatures well below the softening temperature of the alloy will ultimately lead to complete crystallization of the material but would require very long process times and consequently a high volume of "in process" material. For example, the abraded alloy shot comprising about 0.5 percent As, about 12 ppm chlorine and the remainder Se described above required many weeks of heating at about 60° C. to achieve complete crystallization. Heating at high temperatures near the softening temperature of selenium alloy shot or pellets to crystallize the selenium therein, results in the formation of agglomerates or "chunks" that greatly interfere with the proper handling, weighing and the like of shot or pellets prior to the final vacuum deposition step. Thus, an important purpose of the low temperature precrystallization heat treatment is to create essentially complete crystallization of a thin, continuous layer at the outer surface of the alloy beads or pellets sufficient to prevent agglomeration during the subsequent final crystallization step conducted at higher temperatures.

U.S. Pat No. 4,770,965, filed in the name of W. Fender et al on December 23, 1986, a process is described in which selenium-arsenic alloy may be at least partially crystallized by placing the selenium alloy in shot form in a crucible in a vacuum coater and heated to between about 93° C. (200° F.) and about 177° C. (350° F.) for between about 20 minutes and about one hour to increase crystallinity and avoid reticulation. The selenium-arsenic alloy material in short form is preferably heated until from about 2 percent to about 90 percent by weight of the selenium in the alloy is crystallized. This selenium-arsenic alloy material shot may be crystallized completely prior to vacuum deposition to ensure that a uniform starting point is employed. The crystallization of shot using heat at relatively high temperatures, as described in U.S. Pat. No. 4,770,965, can cause agglomeration of the shot particles which renders the shot particles difficult to handle, weigh and the like during processing prior to introduction in a vacuum coater.

After the initial low temperature thermal, pre-crystallization treatment, if the pre-crystallization treatment is employed, the temperature of the shot or pellets is rapidly raised in a final bulk crystallization treatment to at least a second temperature which is below the softening temperature of the particles and which is at least about 20° C. higher than the initial low temperature thermal, pre-crystallization treatment and which lies between about 85° C. and about 130° C. to crystallize at least about 5 percent by weight of the amorphous core of selenium alloy in the particles. Crystallization of 100 percent of the amorphous core of selenium alloy in the particles is preferred for optimum control of fractionation. A typical heating temperature for the final, second crystallization step for selenium alloys containing about 0.5 percent by weight arsenic, based on the total weight of the alloy, is, for example, between about 90° C. and 100° C. A typical heating temperature for selenium alloys containing about 10 percent by weight tellurium, based on the total weight of the alloy, is, for example, between about 95° C. and 105° C. For example, the pre-crystallized alloy shot described above comprising about 0.5 percent As, about 12 ppm chlorine and the remainder Se that was abraded in a Munson Abrader and thereafter heated at about 60° C. for about 3 hours to form a substantially continuous surface crystalline layer, may be completely and rapidly crystallized by ramping the temperature to a much higher temperature, e.g. in the 90° C.–100° C. range for about 3 hours. The alloys beads did not fuse together during the pre-crystallization temperatures and rapidly become 100 percent crystallized while keeping their integrity as separate beads.—An acceptable temperature range for final crystallization, 85° C.–130° C., is determined by the partial vapor pressure of each of the vapor species over the solid at the temperature of interest. The temperature for final crystallization should be such that there is no significant loss of selenium rich species i.e. species whose composition corresponds to a selenium level considerably higher than that represented by the nominal composition within the starting alloy. Loss of selenium rich species contributes significantly to the fractionation problem. The high temperature final crystallization treatment is generally conducted for about 10 hours or less depending upon the degree of crystallization desired. Generally, a high temperature treatment of between about 2 hours to about 10 hours may be employed for temperatures between about 85° C. and and about 130° C.

Shot (beads) or pellets that are 100 percent crystallized are preferred for optimum control of fractionation. Where higher manufacturing throughput is desired, some reduction of the degree of crystallization can be tolerated. For example, the degree of crystallization may, if desired, be reduced to about 5 percent for arsenic or tellurium. The degree of crystallization of selenium alloy shot, beads or pellets can be readily determined by X-Ray diffraction spectra. As indicated above, the pre-crystallization treatment process prevents agglomeration and allows the selenium alloy particles to readily be processed, weighed, distributed evenly within the coater crucibles and the like prior to the final heating step to evaporate the alloy during vacuum deposition. However, if desired, the selenium alloy employed in the vacuum deposition process of this invention may be completely amorphous.

Any pre-crystallization and final crystallization treatments used may be effected well in advance of vacuum deposition of the alloy onto a substrate. If desired, intermediate heating steps may be employed between the pre-crystallization and final crystallization treatments. However, such intermediate heating steps are generally unnecessary.

If desired, the crystallized selenium alloy shot or pellets may be mixed with amoprhous selenium alloy shot or pellets to form the crucible load for vacuum evaporation onto a substrate.

The coating process of this invention varies depending upon the different selenium alloy materials utilized. Moreover, where the selenium alloy deposited is the only photoconductive layer in the final photoreceptor, the selenium alloy may be vacuum deposited in a conventional manner except that the temperature profile used rapidly ramps from a low "hold" temperature of less than about 130° C. to a higher final evaporation temperature, the final evaporation preferably being conducted as quickly as possible without splattering. Splattering causes surface defects. Steep temperature ramping prevents selenium rich species from coming off first from the alloy which, in turn, minimizes fractionation. The ramp profile depends upon whether the selenium alloy contains Te, As, or As and Te. Thus, the final evaporation is preferably conducted at the highest possible temperature without splattering. Typical temperature ranges for ramp heating are from an initial temperature of 20° C. to final temperature of 385° C. for alloys of Se-Te; an initial temperature of about 20° C. to a final temperature of about 450° C. for alloys of Se-As; and an initial temperature of about 20° C. to a final temperature of about 385° C. for alloys of Se-As-Te. Generally, depending on the specific alloy composition employed, the final temperature may range from about 300° C. to about 450° C. for Se-Te alloys, for about 250° C. to about 450° C. for Se-As alloys and from about 300° C. to about 450° C. for Se-Te-As alloys.

The first layer of multiple layered photoreceptors, such as a transport layer, may be deposited by any suitable conventional technique, such as vacuum evaporation. Thus, a transport layer comprising a halogen doped selenium-arsenic alloy comprising less than about 1 percent arsenic by weight may be evaporated by conventional vacuum coating devices to form the desired thickness. The amount of alloy to be employed in the evaporation boats of the vacuum coater will depend on the specific coater configuration and other process variables to achieve the desired transport layer thickness. Chamber pressure during evaporation may be on the order of about $4 \times 10^{-5}$ torr. Evaporation is normally completed in about 15 to 25 minutes with the molten alloy temperature ranging from about 250° C. to about 325° C. Other times and temperatures and pressures outside these ranges may be used as well understood by those skilled in the art. It is generally desirable that the substrate temperature be maintained in the range of from about 50° C. to about 70° C. during deposition of the transport layer. Additional details for the preparation of transport layers are disclosed, for example, in U.S. Pat. No. 4,297,424 to H. Hewitt.

In large vacuum coaters utilized to deposit multiple selenium layers, the layers containing different additives, often utilize a pre-soak "hold" temperature to prevent condensation of selenium alloys that are to be deposited subsequent to the deposition of other selenium layers. These crucibles are normally maintained at an elevated temperature while the first coating layer is deposited. It has been discovered that this elevated temperature during the pre-soak hold period causes loss of selenium and selenium rich species from the selenium alloy in the "hold" crucibles and aggravates fractionation.

By avoiding long exposure of the selenium alloy to the high temperatures of the pre-soak hold, fractionation is reduced. Thus, high temperatures for crucibles containing alloys for subsequently deposited alloy layers are used only during the period of evaporation of the subsequently deposited alloys. Preferably, the temperatures for crucibles containing alloys for subsequently deposited alloy layers are held at a temperature of less than about 130° C. during the pre-soak hold period when underlying selenium containing layers are deposited. For example, in multilayered photoreceptors where the alloy layer contains selenium alloys with tellurium and/or arsenic in a top or upper layer, the crucible for the top or upper layer alloy has in the past been kept at high temperatures, e.g. at about 190° C.-200° C., to prevent condensation of the base layer material onto the crucibles and the pellets or shot. It has now been determined that such high temperatures can allow the early sublimation of selenium and selenium rich species from the source alloys resulting in a higher than desirable top surface tellurium and/or arsenic concentration on the photoreceptor film. This selenium sublimation promotes variability in the top film concentration, thus variability in photosensitivity, and/or charge acceptance and/or mechanical wear properties, for example. Therefore, for multi layered photoreceptors where the top alloy layer contains selenium alloys with tellurium and/or arsenic in a top or upper layer, the alloy is kept as cool as practical while avoiding evaporants from condensing on the top layer alloy crucibles during evaporation of the underlying layers. The temperature of the alloy should be kept in a temperature zone within which the vapor pressure of the selenium rich species is low, such as below about 130° C. It should be noted that while the pre-soak hold temperature should not be independently controlled above 130° C., it is possible that the heat of condensation may drive the top layer crucible temperature to about 160° C. for a short time.

Steep temperature ramp heating is desirable for every type of selenium alloy evaporation. Thus, for photoreceptors where the Se-Te alloy is in the last layer, a temperature ramp from 130° C. to about 385° C. in a period of about 15 minutes is satisfactory. Generally, depending on the specific alloy composition employed, the final temperature may range from about 300° C. to about 450° C. for Se-Te alloys.

In the process of this invention, tellurium and arsenic fractionation are controlled within narrower limits. In addition, photoreceptor fabrication yields are improved. By avoiding long exposure of the selenium alloy in the hold crucibles to high temperatures, fractionation is reduced. Thus high temperatures are used only during the period of evaporation.

Fractionation control on the process of this invention is sufficiently good that photoreceptors having good electrical properties may be fabricated with charge generator layers of selenium alloys having for example, thicknesses of between about 0.5 micrometer and about 10 micrometers.

Top surface arsenic concentrations can be reduced from several percent to below 1 percent with the materials of this process for SeAs alloys with nominal starting compositions comprising less than 0.5 percent by weight of arsenic. Top surface tellurium concentrations can be reduced from in excess of 16 percent by weight to less than about 12 percent by weight with the materials of this process for SeTe alloys with nominal starting compositions comprising 10 percent or less by weight tellurium.

A number of examples are set forth herein below that are illustrative of different compositions and conditions that can be utilized in practicing the invention. All proportions are by weight unless otherwise indicated. It will be apparent, however, that the invention can be practiced with many types of compositions and can have many different uses in accordance with the disclosure above and as pointed out hereinafter.

EXAMPLE I

One photoreceptor preparation control run was made (crucible program A referenced below). Additional runs were made for comparative purposes. Each run was conducted from a batch of about 37.3 kg of selenium-tellurium-arsenic beads formed by water quenching droplets of a molten alloy comprising about 89 percent by weight selenium, about 11 percent by weight tellurium, based on the total weight of the beads, and having an average particle size of about 2200 micrometers. The batch was rapidly ground into a fine powder having an average particles size of about 30 micrometers in a hammer mill grinder (Paudel Grinder, Model 2A, available from Fuji Industries, Japan) for about 5 minutes. The ground alloy powder was then compressed into pellets having an average weight of about 300 mg in a pelletizer (Hata Pelletizer, Model HPT-22A, available from Hata Iron Works, Japan). Compression pressure in the pelletizer was about 15000 kg/cm² and the pellets had a length of about 3 mm and a diameter of about 6 mm. The resulting batch of alloy pellets was thereafter employed to fabricate a plurality of control electrophotographic imaging members. The electrophotographic imaging members were prepared by vacuum evaporating chlorine doped arsenic selenium charge transport alloy material comprising about 99.5 percent by weight selenium, 0.5 percent As and about 20 ppm chlorine, based on the total weight of the layer onto aluminum substrates and thereafter vacuum depositing the selenium-tellurium alloy pellets. The chlorine doped arsenic selenium alloy was evaporated from stainless steel crucibles at an evaporation temperature of between about 280° C. and about 330° C. and an evaporation pressure between about $4 \times 10^{-4}$ torr and $2 \times 10^{-5}$ torr. This transport layer coated substrate was thereafter coated with the selenium-tellurium alloy pellets described above to form a charge generating photoconductive layer having a thickness of about 5 micrometers and containing about 11 percent by weight tellurium and the remainder selenium. This alloy was evaporated at a temperature of between about 300° C. and about 350° C. for stainless steel crucibles at a pressure of about $2 \times 10^{-5}$ torr. The resulting electrophotographic imaging members were tested. A variety of top layer crucible programs were utilized as identified below (crucible programs B through E referenced below). Quoted times represent the elapsed time for the top layer crucibles at the temperatures specified.

(A) Control Top Layer Crucible Program

TABLE I

| Time (mins) | 0.1 | 7 | 18 | 13 | 10 | 13 |
|---|---|---|---|---|---|---|
| Temp (°C.) | 10 | 149 | ramp to 199 | 199 | ramp to 315 | 315 |

(B) Temperature ramped from 10° C. to 196° C. in six minutes and held at 196° C. presoak for 31 minutes.

TABLE II

| Time (mins) | 0.1 | 6 | 31 | 10 | 13 |
|---|---|---|---|---|---|
| Temp (°C.) | 10 | ramp to 196 | 196 | ramp to 315 | 315 |

(C) Top layer crucibles were kept at 21° C. during base layer evaporation. Top layer crucibles were then ramped from 21° C. to evaporation temperature of 335° C. in 12 minutes.

TABLE III

| Time (mins) | 38 | 12 | 12 |
|---|---|---|---|
| Temp (°C.) | 21 | ramp to 335 | 335 |

(D) Top layer crucibles were kept at 104° C. during base layer evaporation. Top layer crucibles were then ramped from 104° C. to 355° C. evaporation temperature in 12 minutes.

TABLE IV

| Time (mins) | 0.2 | 6 | 31 | 12 | 12 |
|---|---|---|---|---|---|
| Temp (°C.) | 21 | ramp to 104 | 104 | ramp to 335 | 335 |

(E) Top layer crucibles were kept at 213° C. during base layer evaporation. Top layer crucibles were then ramped from 213° C. to evaporation temperature of 335° C. in 12 minutes.

TABLE V

| Time (mins) | 0.1 | 6 | 31 | 12 | 12 |
|---|---|---|---|---|---|
| Temp (°C.) | 21 | ramp to 213 | 213 | ramp to 335 | 335 |

The improved top layer fractionation characteristics for photoconductors coated under conditions where pre-soak temperatures are maintained low are shown in Table VI. The column on the right displays the 8kV TST values in percent by weight Te from electron microprobe analysis. At 8kV probe energy, the average excitation depth of the detected X-rays is on the order of 0.1 micrometer. Conditions C and D indicate lower levels of TST and therefore lower levels of fractionation for those crucible programs where the temperature of the top layer alloy, and therefore the loss of selenium rich species, is maintained low.

TABLE VI

| Experimental Variables | 8 kV TST |
|---|---|
| A | 11.65 |
| B | 11.70 |
| C | 10.96 |
| D | 10.66 |
| E | 11.5 |

EXAMPLE II

An alloy material comprising about 88 percent by weight selenium and about 12 percent by weight tellurium, based on the total weight of the alloy was initially prepared as beads formed by water quenching droplets of a molten alloy having an average particle size of about 2200 micrometers. A first batch of material was abraded and subsequently precrystallized so that the material was 100 percent crystalline as determined by X-ray diffraction. This first batch of crystallized alloy was used to fabricate a plurality of electrophotographic imaging members. A second batch of amorphous selenium alloy particles were employed to fabricated a plurality of control electrophotographic imaging members. All these electrophotographic imaging members were prepared by evaporating the alloy shot onto aluminum substrates. Initially, instead of rapidly raising the temperature of the alloy to evaporation temperatures, both the amorphous and crystallized alloy shot were held at 200° C. for about 8 minutes. These alloy batches were thereafter evaporated at a temperature of between about 350° C. and about 400° C. from stainless steel crucibles at a pressure of about $2 \times 10^{-5}$ torr. The substrate temperature was maintained at about 60° C. during the evaporation coating operation. The photoreceptors from the batches were tested for top surface concentration of tellurium (TST). Testing was effected by detaching the deposited film from the substrate and determining the tellurium concentration at the top surface by electron microprobe analysis. The resulting selenium-tellurium alloy layers had the characteristics listed in Table VII below for samples #1 and #2. Values are listed in percent by weight Te. A third set of photoreceptors was coated from the first (precrystallised) batch of alloy in a manner identical with that for samples #1 and #2 except that the temperature of the alloy was raised rapidly to the evaporation temperature of between about 350° C. and about 400° C. without an intermediate hold temperature period at 200° C. The resulting selenium-tellurium layers had the characteristics listed in Table VII below for sample #3.

TABLE VII

| SAMPLE # | TST | |
|---|---|---|
| | 8 kV (0.1 μm) | 17 KV (0.5 μm) |
| 1. Se—Te Alloy (12% Te) Amorphous-Shot | 42.1 | 32.3 |
| 2. Se—Te Alloy (12% Te) Crystallized-Shot | 38.2 | 24.0 |
| 3. Se—Te Alloy (12% Te) Crystallized-Shot | 12.3 | 12.7 |

The results shown in Table VII, top surface tellurium values from electron microprobe analyses, demonstrate that holding the alloy at elevated temperatures (above 130° C.) under vacuum promotes the early loss of selenium rich species and thereby increases the level of fractionation and that for low fractionation the crucibles should be ramped as rapidly as possible from a low temperature below about 130° C. to the evaporation temperature (between about 350° C. and 400° C.).

Although the invention has been described with reference to specific preferred embodiments, it is not intended to be limited thereto, rather those skilled in the art will recognize that variations and modifications made be made therein which are within the scope of the invention and within the scope of the claims.

What is claimed is:

1. A process for fabricating an electrophotographic imaging member comprising providing in a vacuum chamber at least one first layer crucible containing particles of selenium or a selenium alloy, at least one second layer crucible containing particles of an alloy comprising selenium and an alloying component selected from the group consisting of tellurium, arsenic, and mixtures thereof, and a substrate, applying a partial vacuum to said vacuum chamber, heating said particles in said first layer crucible to deposit a thin continuous selenium or a selenium alloy first layer on said substrate, maintaining said particles in said second layer crucible at a first temperature below about 130° C. while said thin continuous selenium or a selenium alloy first layer is being deposited on said substrate, and rapidly heating the particles in said second layer crucible to a second temperature between about 250° C. and about 450° C. to deposit a thin continuous selenium alloy second layer on said substrate.

2. A process for fabricating an electrophotographic imaging member in accordance with claim 1 wherein said first layer is a charge transport layer of a selenium arsenic alloy.

3. A process for fabricating an electrophotographic imaging member in accordance with claim 1 wherein said second layer is a charge generator layer.

4. A process for fabricating an electrophotographic imaging member in accordance with claim 1 including rapidly raising the temperature of said second layer crucible to between about 300° C. and about 375° C. in between about 5 minutes and about 18 minutes at the completion of evaporation of said particles of selenium or a selenium alloy from said first layer crucible.

5. A process for preparing an electrophotographic imaging member in accordance with claim 4 wherein said alloy comprises a halogen dopant.

6. A process for preparing an electrophotographic imaging member in accordance with claim 4 wherein said alloy comprises an alloy of selenium and arsenic.

7. A process for preparing an electrophotographic imaging member in accordance with claim 4 wherein said alloy comprises an alloy of selenium and tellurium.

8. A process for preparing an electrophotographic imaging member in accordance with claim 4 wherein said alloy comprises an alloy of selenium, arsenic and tellurium.

9. A process for preparing an electrophotographic imaging member in accordance with claim 4 wherein said heating of said particles to a temperature between about 85° C. and and about 130° C. is maintained until 100 percent of said amorphous core of selenium alloy in said particles is crystallized.

10. A process for preparing an electrophotographic imaging member in accordance with claim 4 comprising, prior to rapid heating said particles in a vacuum coater, preparing a mixture of said particles in which 100 percent of said amorphous core is crystallized and additional particles of an amorphous alloy comprising selenium and a dopant selected from the group consisting of tellurium, arsenic, and mixtures thereof, said additional particles having an average particle size of at least about 300 micrometers and an average weight of less than about 1000 mg, said additional particles comprising up to about 75 percent by weight of the total weight of said mixture.

11. A process for preparing an electrophotographic imaging member in accordance with claim 1 wherein said particles of an alloy comprising selenium and an alloying component selected from the group consisting of tellurium, arsenic, and mixtures thereof are beads.

12. A process for preparing an electrophotograhic imaging member in accordance with claim 1 wherein said particles of an alloy comprising selenium and an alloying component selected from the group consisting of tellurium, arsenic, and mixtures thereof are pellets.

* * * * *